(12) United States Patent
Gillenwater et al.

(10) Patent No.: US 6,557,115 B2
(45) Date of Patent: *Apr. 29, 2003

(54) REAL-TIME TEST CONTROLLER

(75) Inventors: Russel L. Gillenwater, Round Rock, TX (US); Philip J. Brisky, Manchaca, TX (US); Kenneth G. Keels, Austin, TX (US)

(73) Assignee: Compaq Computer Corporation, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/992,193

(22) Filed: Nov. 14, 2001

(65) Prior Publication Data

US 2002/0053045 A1 May 2, 2002

Related U.S. Application Data

(63) Continuation of application No. 09/295,465, filed on Apr. 19, 1999, now Pat. No. 6,338,148, which is a continuation of application No. 08/150,691, filed on Nov. 10, 1993, now abandoned.

(51) Int. Cl.$^7$ .................................................. H02H 3/05
(52) U.S. Cl. ........................................... 714/25; 714/18
(58) Field of Search .............................. 714/25, 26, 27, 714/30, 718, 724

(56) References Cited

U.S. PATENT DOCUMENTS

| | | | |
|---|---|---|---|
| 4,642,782 A | 2/1987 | Kemper et al. ............. | 364/550 |
| 4,654,852 A | 3/1987 | Bentley et al. ............. | 371/29 |
| 4,841,456 A | 6/1989 | Hogan, Jr. et al. .......... | 364/550 |
| 4,885,757 A | * 12/1989 | Provence .................... | 375/341 |
| 5,023,817 A | * 6/1991 | Au et al. .................... | 365/209 |
| 5,036,479 A | 7/1991 | Prednis et al. .............. | 364/580 |
| 5,090,014 A | 2/1992 | Polich et al. .............. | 371/15.1 |
| 5,107,499 A | 4/1992 | Lirov et al. ................ | 371/15.1 |
| 5,107,500 A | 4/1992 | Wakamoto et al. ........ | 371/15.1 |
| 5,293,387 A | * 3/1994 | Booth ........................ | 714/737 |
| 5,381,417 A | 1/1995 | Loopik et al. ............. | 371/15.1 |
| 6,338,148 B1 | * 1/2002 | Gillenwater et al. .......... | 714/25 |

OTHER PUBLICATIONS

Cantone, et al. IN–ATE: Fault Diagnosis as Expert System Guided Search, *Computer Expert Systems*, Springer–Verlag, Heidelberg, 1987.

Computer V19, N7, pp. 68–76, 1986.

Guided Search, *Computer Expert Systems*, Springer–Verlag, Heidelberg, 1987.

Pipitone, F., The FIS Electronics Troubleshooting System Guided Search, *Computer Expert Systems*, Springer–Verlag, Heidelberg, 1987.

* cited by examiner

*Primary Examiner*—Dieu-Minh Le
(74) *Attorney, Agent, or Firm*—Fenwick & West LLP

(57) ABSTRACT

The real-time test controller maintains a failure database containing a history of past failures for devices under test and selectively sorts the history for the device to be tested. The diagnostic testing sequence is then rearranged with tests having higher failure rates being conducted first. If faults are detected, a message is provided to the operator and the failure database is either manually or automatically updated with the latest fault information. In this manner, a continuously updated history of faults is maintained and the most efficient testing sequence is followed, resulting in significant time and cost savings.

18 Claims, 7 Drawing Sheets

FIG. 5

| Field Name | Field Contents | Field Type | Length |
|---|---|---|---|
| project | Name of Project Board Used In | character | 25 |
| board | Name of Board | character | 25 |
| tpn | Tandem Part Number | character | 6 |
| brd_rev | Revision Level of Board | character | 6 |
| trackcode | Board Track Code | character | 10 |
| diag_rev | Revision Level of Diagnostics | character | 6 |
| emp_num | Employee Number of Debug Technician | character | 6 |
| date_of | Date of Failure | date | 8 |
| test | Failing Test | character | 4 |
| sub_test | Failing Sub-Test | character | 4 |
| func_blk | Failing Functional Block | character | 4 |
| error_num | Error Number Generated by Failing Test | character | 4 |
| error_mess | Error Message Generated by Failing Test | memo | unlimited |
| failure | Failure Type | character | 25 |
| part_type | Failing Part Part Type | character | 12 |
| ref_des | Failing Part Part Designator | character | 12 |
| vendor | Failing Part Vendor | character | 25 |
| date_code | Failing Part Date Code | character | 6 |
| comments | General Comments | memo | unlimited |

REAL-TIME TEST CONTROLLER

CROSS-REFERENCE TO RELATED APPLICATIONS

This application is a continuation of application Ser. No. 09/295,465, now U.S. Pat. No. 6,338,148, filed Apr. 19, 1999, which is a continuation of application Ser. No. 08/150,691, filed Nov. 10, 1993, now abandoned. Each of the above applications is incorporated by reference herein in its entirety.

BACKGROUND OF THE INVENTION

1. Field of the Invention

The present invention generally relates to systems and methods for diagnostic testing performed during a manufacturing process. More particularly, the present invention relates to methods and apparatus for controlling diagnostic testing processes.

2. Description of the Prior Art and Related Information

Practically all manufactured goods undergo some testing to ensure that manufacturing defects are not present. Also, testing may be necessary to ensure that: the goods perform up to a certain level, such as minimum design specifications, military/government contract specifications, etc. In the case of complex manufactured goods, certain flaws or failure to meet design specifications may only be detectable after final assembly, through one of a series of diagnostic tests.

For example, this is particularly true in the manufacture of computers, and computer related products, which often include numerous parts manufactured by independent suppliers. A manufacturer of computer products using parts supplied by third parties generally individually tests such parts as a routine matter. However, flaws in such parts may only be detectable when functioning together with the overall computer system. Further, a circuit board for a computer can require hundreds, and possibly thousands, of electrical connections to be made. It is often necessary for each connection to be tested, followed by testing of the overall board.

Normally, there are numerous levels of diagnostic tests run during a testing process, whether at a final stage of assembly or an intermediate stage, each test seeking to detect a particular fault or faults. Diagnostic test sequences are typically determined by a diagnostic engineer prior to manufacturing, with the same test sequences being run for the entire life-cycle of the product.

In the manufacturing process, time can often directly translate into money. This is a significant concern to most, if not all, manufacturers. In many cases, an hour or more of non-production test time can be wasted if a diagnostic test which appears late in the testing process fails.

For example, in the manufacturing of a typical circuit board (or Printed Wire Assembly-PWA), testing costs can run from $80–$100 per hour, or more, for each PWA. Wasted testing time can thus be responsible for a significant amount of unnecessary costs being added to each device under test. Any reduction in testing time can result in significant cost savings for the finished product and result in considerable cost savings to the manufacturer. Unfortunately, prior art testing procedures do not adequately address the problems of wasted testing time and thus result in considerable time and money being wasted due to an inefficient, rigid testing process.

Accordingly, a need presently exists for an improved diagnostic testing routine which is efficient:, flexible, adaptive, and which addresses the above-noted problems with typical diagnostic testing procedures.

SUMMARY OF THE INVENTION

The present invention provides a method and apparatus for controlling, in real-time, the diagnostic testing of a manufactured product, resulting in optimization of the diagnostic test sequence by optimizing the order in which the diagnostic tests are run.

During manufacturing, several diagnostics are often run against a product, with each diagnostic being designed to identify a specific fault. In an ideal manufacturing process, faults occur in a random fashion. In such a case, the sequence in which diagnostic tests are run makes no difference since it is not possible to predict which fault will occur next. In reality, however, faults often occur in "clumps" which may be defined as "non-random fault clusters" or "NRFCs." If the diagnostic test which detects a fault which is part of a NRFC is run late in the testing process, a significant amount of testing will be wasted due to the high likelihood of failure of the test associated with the NRFC.

When a NRFC occurs in the testing process as discussed above, there is suddenly a single diagnostic test which fails repeatedly. With the typical diagnostic test system, there is no way to control in real-time when the diagnostic: which would detect the NRFC fault is run in the test sequence since the sequence is preset by the diagnostic engineer during the design phase of the product.

The present invention provides a controller for controlling testing procedures in a manufacturing or test facility. The controller includes a real-time diagnostic optimizer which detects non-random fault clusters, or NRFCs, determines which diagnostics detect the NRFC faults, produces an optimized sequence of diagnostics which reflect the detected NRFCs, and transfers the optimized sequence of tests to the device which is being tested.

In this fashion, when an NRFC exists, it is tested for first. In most cases, the dominant fault is detected by the first few diagnostics, and the test process terminates, allowing technicians to quickly address the detected fault. This system significantly reduces test time and results in significant time/cost savings.

In a preferred embodiment, the test controller of the present invention incorporates five distinct components, all of which operate under a common hardware configuration. These components include: a command line interface with the component under test; diagnostics which may or may not reside in the component under test; a test failure database; a command module (CM); and a diagnostic optimizer.

In general, when a board fails a test, data relating to the failure type, the failing diagnostic, date and time, and any other desired data, are logged into the failure database. This can be done either automatically by the controller or manually by a test technician. The failure database acts as a repository for the failure data, and later for the repair data required to correct the failure. The failure database collects this data sequentially, according to entry date.

As each new test is performed, the CM in the controller contacts the diagnostic optimizer which is responsible for querying the failure database. The diagnostic optimizer determines a fault spectrum of the most recent failures. The fault spectrum enables the diagnostic optimizer to detect nonrandom fault clusters which occurred during previous testing routines.

The system components of the controller work in a repeating real-time cycle with the failure database continuously logging failures, the diagnostic optimizer searching the failure database to generate an optimized sequence of diagnostics, the command module requesting this data from the diagnostic optimizer and delivering it to the command line interface, and finally, the command line interface using the optimized data to re-sequence the diagnostics to match the optimized testing routine which is built around detected non-random fault clusters.

The present invention thus provides a test controller for providing an optimized testing sequence which will detect, in a more efficient and cost-effective manner, failures occurring in products under test. This allows the present invention to eliminate wasted time in the testing process and to concentrate on known testing difficulties, thereby providing the manufacturer, and ultimately the consumer, with a substantial savings.

Additional features and advantages of the present invention will be appreciated by a review of the following detailed description of the present invention when considered in light of the drawings.

BRIEF DESCRIPTION OF THE DRAWINGS

FIG. 5 is a sample database structure which may be used with the failure database shown in FIG. 2;

DETAILED DESCRIPTION OF THE INVENTION

Figure 1:
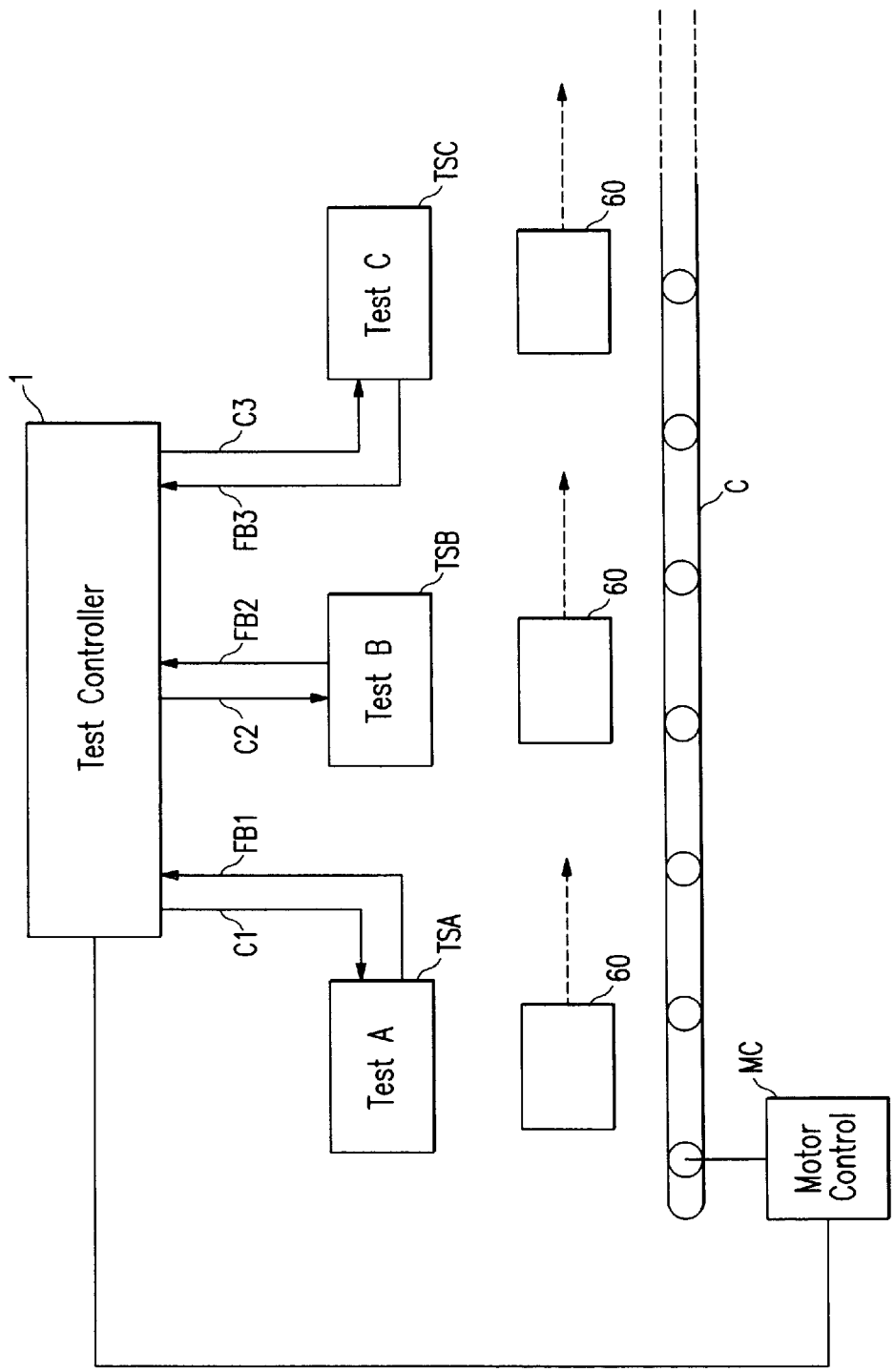
FIG. 1 is a block diagram showing a general configuration of the real-time diagnostic test controller in accordance with an embodiment of the present invention.

FIG. 1 illustrates the real-time test controller 1 set up to test a device 60. The device 60 under test may comprise a single device or the test controller 1 can control the testing of a plurality of devices simultaneously. Tests, for example A, B, and C, are conducted at locations identified as Test Station A (TSA), Test Station B (TSB), and Test Station C (TSC), respectively. Locations TSA, TSB, and TSC may be physically separate testing locations or may comprise a single location such as a test bed in a testing facility. The present invention is not limited to the number of tests or locations illustrated.

For example, it is common in manufacturing facilities to have a series of tests conducted at different levels and at different locations in the manufacture of a product. Thus, 20 tests may be conducted at 14 different locations during the assembly of a wheel structure in an automotive plant, and 30 tests may be conducted at 7 different locations after the wheel structure is mated with an axle. The finished product, i.e., an automobile, will then undergo another series of tests (e.g., electrical systems, mechanical structures, adherence to design tolerances, heating/air conditioning, exposure to water/sun/ice, etc.) at numerous locations. In such a situation, the test controller 1 of the present invention would control the testing process throughout the various stages and levels of testing.

The controller 1 may be located at a particular test location or may be located at a remote sight. For example, when a single testing location is used, the test controller 1 may be directly connected to the devices 60 and control the series of tests, e.g., A, B, C. Or, for example, the controller 1 may be located at a main manufacturing sight and testing locations may be located both at: the main manufacturing facility and in a remote assembly location.

The test controller 1 communicates with each test location or device 60 via communications lines such as C1, C2, and C3. Further, the testing locations or devices feed back information to the test controller 1 via feedback channels FBI, FB2, and FB3. Such communications may be conducted in numerous ways, and the present invention is not limited to a particular form of communication. For example, communication lines C1, C2, and C3, and feedback lines FBI, FB2, and FB3 may comprise direct connections, telecommunications using modems, fiber-optic communications, cellular communications, or any other method of communicating from one location to another.

The test controller 1 controls the testing of the devices 60 in a manner which optimizes the testing procedure. The test locations TSA, TSB, TSC, etc. provide real-time feedback of test results to the controller 1. The test controller 1 determines an optimum sequence for conducting the series of tests on a particular device 60 based on a fault spectrum derived from a constantly updated history of tests conducted for the particular device. Through the real-time feedback of test results, the test controller is able to constantly maintain control of the testing process, and will re-sequence the tests for a device 60 if the prior history of testing for such a device suggests the occurrence of test or tests which have a higher incidence of failure than other tests.

Thus, for example, if a device undergoes automated testing comprising a series of tests at a corresponding series of test stations, automatically moving from one station to another along a moving mechanism C which may be a conveyor or other suitable moving mechanism in the direction as shown by the dashed arrows in FIG. 1, the test controller 1 can control the movement of the device 60 from one station to another to control the sequence in which the tests are conducted. The test controller 1 simply supplies a computerized motor controller MC with an appropriate command to control the movement of the moving mechanism C. In this manner, wasted testing time may be avoided by conducting tests most likely to be passed later in the testing process.

Further, as mentioned above, the present invention can control testing in one location while being positioned in another. For example, the test controller 1 can be used in conjunction with technicians in the field at customer sites to assist in the debugging of malfunctioning equipment. In such a situation, the test controller may comprise a personal computer or similar device, and the field technician may conduct testing using a portable or laptop computer. Using modems to communicate, the test controller 1 can control the testing of the customer's equipment via the portable or laptop computer.

One of the advantages of this remote capability is the avoidance of unnecessary equipment returns. That is, in the computer field it is not uncommon, for example, for a technician conducting field service of a customer's computer installation to replace three, four, or five: integrated circuit boards with new equipment to get the customer up and running. Once back at the test facility, it is often the case that only one of the removed boards is bad. Since circuit board costs for large computer systems can often extend into the tens of thousands of dollars, the ability to diagnose the problem and replace a single board can represent a significant cost savings.

To illustrate the above points and other novel features of the present invention, it will be useful to utilize a particular product as an example when discussing the details of the real-time test controller 1. Accordingly, for purposes of illustration only, the following discussion is conducted using printed wire assemblies, i.e. PWAs, as an example of a product undergoing test. It is to be understood that the present invention is in no way limited to use with printed wire assemblies, but that the invention is applicable to any manufactured goods which undergo a testing procedure.

Figure 2:
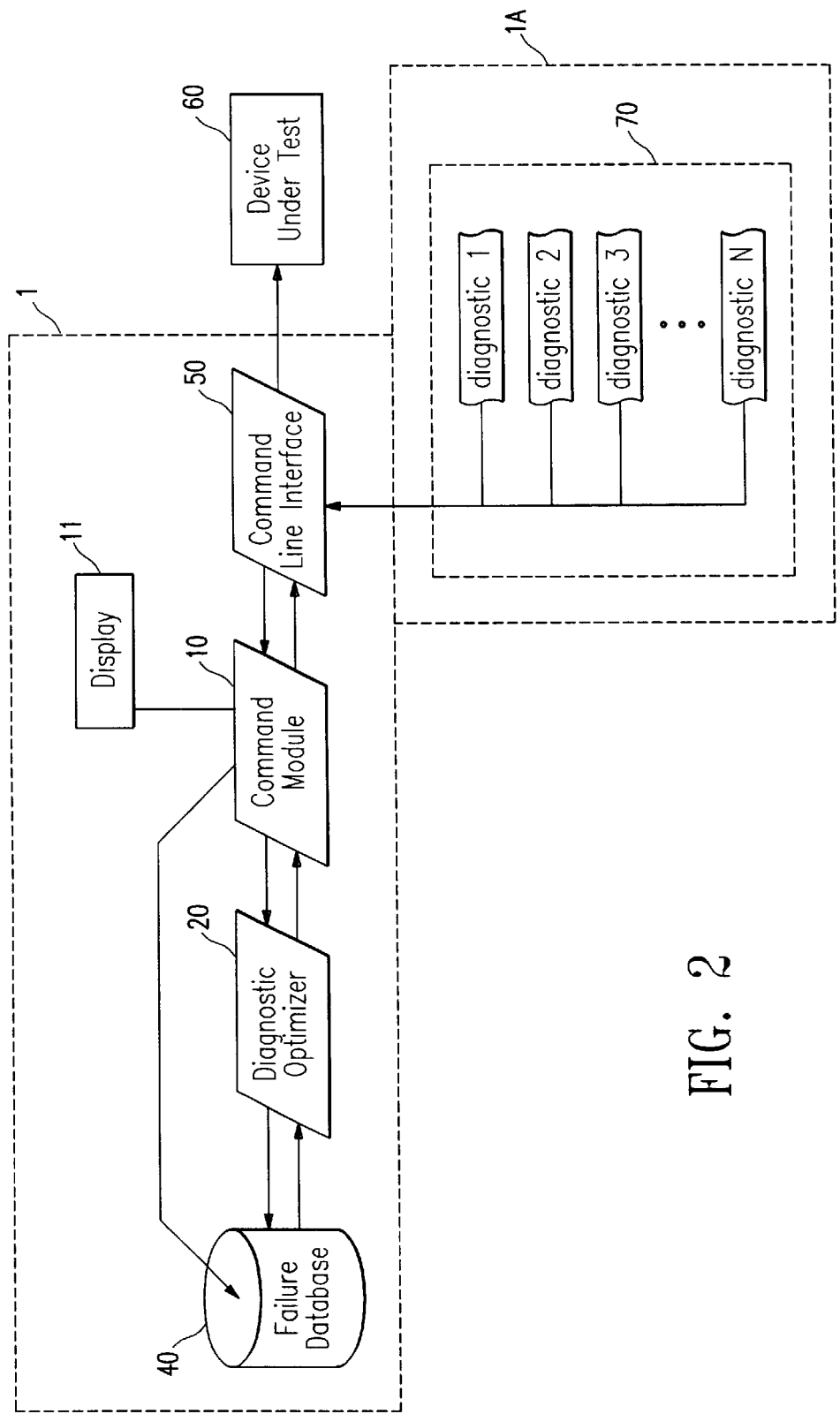
FIG. 2 is a block diagram showing the real-time diagnostic test controller in accordance with a preferred embodiment of the present invention.

As illustrated in FIG. 2, the real-time test controller 1 of the present invention includes a command module 10 (CM). The CM 10 provides a user interface with the command line interface 50 for the PWA 60 that is undergoing the testing procedure. The CM 10 serves to simplify the interface between the user and the device under test.

The real-time controller 1 in FIG. 2 is shown by the dashed lines. Included in the controller 1 are the CM 10 discussed above, a diagnostic optimizer 20 (which produces an optimized sequence of diagnostics for a PWA under test), a failure database 40, and a command line interface 50.

Diagnostic tests 70, which are shown in dashed lines 1A, are considered part of controller 1 but are separately identified since such tests may reside on the component under test. In particular, it is common for a PWA or other electronic devices to include a read only memory ("ROM") which has stored therein a series of diagnostic tests. Unless otherwise specified at the test facility, such as through the test controller 1, tests stored in such a ROM will normally be run in a preset order indicated by the diagnostic engineer.

The user interacts with the controller 1 through the CM 10 to initiate a testing procedure. The CM 10 instructs the diagnostic optimizer 20 to access the failure database 40. The CM 10 supplies the diagnostic optimizer 20 with information regarding the device 60 which is undergoing testing. This information may be passed interactively, through an intermediate file, or by some other means.

For example, the diagnostic optimizer 20 is supplied with information regarding the PWA type, which diagnostic test data logged in the failure database is valid, how far back to search the failure database for information regarding the PWA, etc. The diagnostic optimizer 20 utilizes this information to search the failure database 40 to produce a fault: spectrum of the faults which have occurred in similar PWAs which have undergone testing previously. A fault spectrum shows the frequency of failures of tests conducted on the PWA for a designated period of time.

Utilizing the fault spectrum information derived from the failure database 40, and the parameters supplied through the CM 10, the diagnostic optimizer 20 produces an optimized sequence of diagnostics to be utilized in the testing of the PWA 60. The diagnostic optimizer 20 transfers the optimized diagnostic sequence to the CM 10 which then instructs the command line interface 50 to utilize the optimized diagnostic sequence to conduct the testing of the PWA 60. The optimized diagnostic sequence may be passed interactively, by an intermediate file, or by some other means.

As can be seen in FIG. 2, a typical testing sequence for a PWA 60 will involve numerous diagnostics 70. The diagnostic optimizer 20 re-sequences the order in which diagnostics numbered 1-N are run. The fault spectrum produced by the diagnostic optimizer serves to detect faults which are part of a non-random fault cluster. The resequencing of the diagnostic tests attempts to cause the diagnostic test which is most likely to fail to be run first (i.e., the diagnostic test which detects a NRFC fault).

The CM 10 is a mouse driven graphical user interface (GUI) which includes a debug and high grade mode, on-line help, automatic printing of error tags, automatic programming of manufacturing data, manual programming of manufacturing data, the ability to create, save and load customized testing sequences, terminal emulation mode, support for downloading diagnostics from a PC to, for example, a printed wire assembly memory, etc.

The high grade mode of operation, sometimes referred to as "golden board" testing, compares a product under test with a known good product. In this mode, limited information is provided to the person conducting the testing. In a debug mode, where the user is using the test equipment to isolate the fault with the product, maximum information is provided to the user to assist in isolating and fixing the fault. In a typical local area network environment, the CM 10 will reside on the server, but will run on each individual terminal when it is invoked. Alternatively, the CM 10 could be stored in a dedicated ROM (or other type) memory module in a PC based system.

Essentially, the CM takes frequently used commands and automates them to reduce the amount of time the user spends executing frequent tasks. This provides additional time savings in the testing process since the user can accomplish in one-key stroke what may require 60 or 70 key strokes without the command module.

Figure 3:
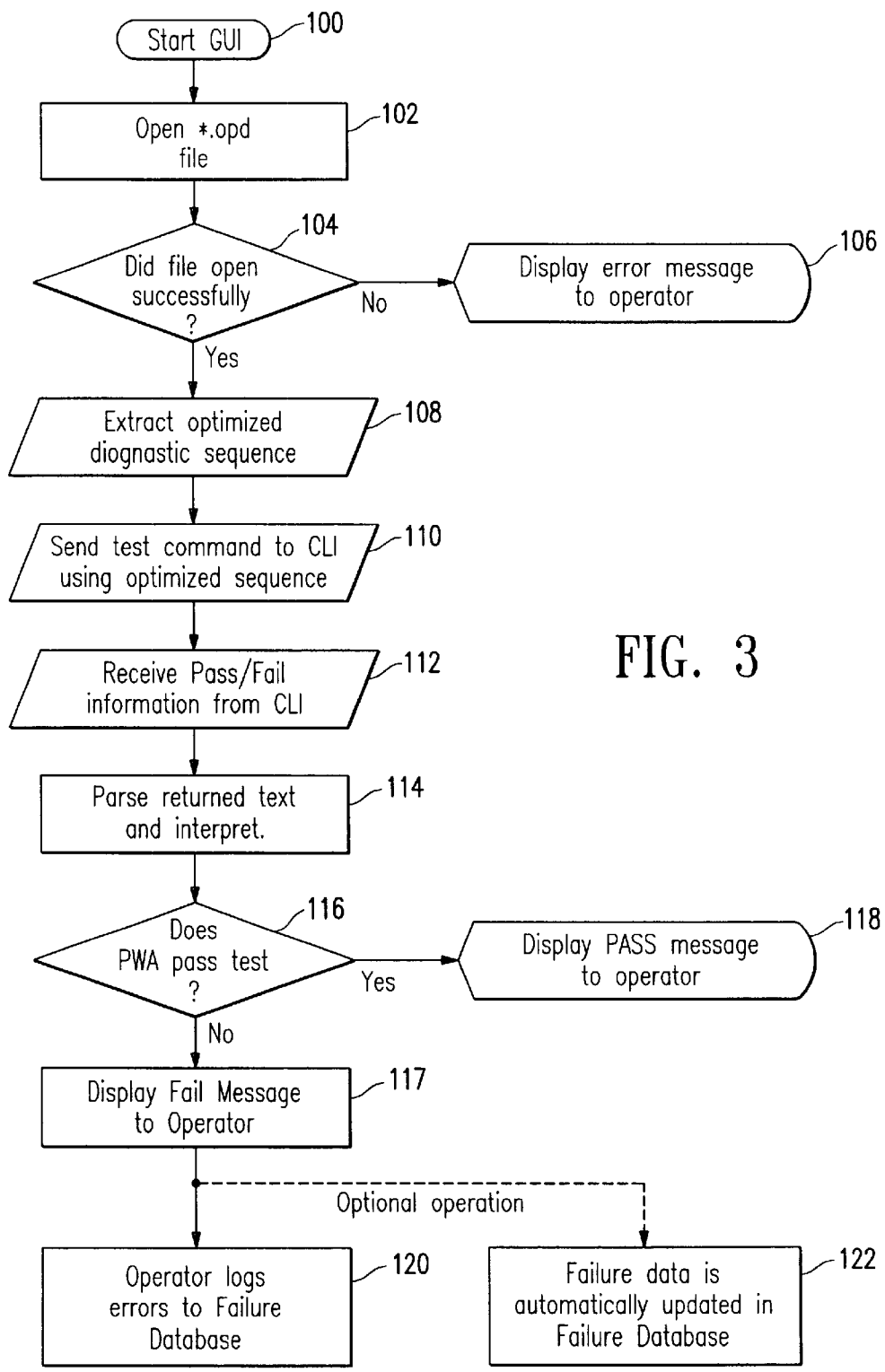
FIG. 3 is a flow chart of a preferred embodiment of the command module shown in FIG. 2.

Referring to the flow diagram for a preferred embodiment of the command module 10 shown in FIG. 3, at step 100, the CM 10 is started. As with all software routines, this step typically involves defining variables, initializing screens, etc. At step 102, the command module opens an optimized file. As mentioned above, and discussed in more detail below, the optimized file is created by the diagnostic optimizer 20. At step 104 a test is then conducted to determine if the optimized file opens successfully. If for some reason the file was not opened successfully, e.g., if it has not been created or it has been erased, an error message will be displayed to the operator in step 106.

Upon successful opening of the optimized file, the CM 10 parses the optimized file in step 108 to extract the optimized diagnostic sequence which has been determined by the diagnostic optimizer 20. The term "parse" or "parsing" is generically used to mean searching a file or line for a particular pattern. In order for the searching operation to operate effectively, the file or line searched should follow some predefined rules or format.

Once the CM 10 has the optimized diagnostic sequence, the command line interface 50 is then commanded at step 110 to begin testing using the optimized sequence. An example of a command from the CM to the command line interface 50 to begin testing could be as follows:

DEX>Seq/v/m 8, 9, 3, 5, 6, 2

As with the parsing operation, in order for the command module 10 to communicate with the command line interface 50, the data sent to the command line interface 50 should have a standardized input format. For example, in the preferred embodiment command line interface commands follow the format of <command> <options> <tests>. This permits the CM 10 to translate button clicks in menu selections into a text string which the command line interface 50 can utilize. Without a standardized input format, CM/command line interface communication would likely not be possible.

Looking at the above command, "DEX>" is a command line interface generated prompt. "SEQ" is the command to execute a sequence of tests. The "/v/m" are user selectable options. Finally, the numbers "8, 9, 5, 6, 2" would be the tests to be executed in the order of execution. While the above command could be typed in by the user, the CM 10 generates the command based on, for example, a double-click from a mouse when a curser is positioned on a selected icon or option on a user display. This simplifies the operation for the user, particularly when there may be 10, 20 or more tests o be run.

The CM 10 waits for the command line interface to complete the test and then receives, at step 112, past/fail information from the command line interface 50. The past/fail information from the command line interface 50 has a standardized data format for the CM to interpret.

An example of a "passing" data format from the command line interface 50 is as follows:

Passes=00000001 Failures=00000000

"Passes" indicates the number of times the test was run successfully and "Failures" indicates the number of times the device failed the test.

An example of a "failing" data format from the command line interface 50 is as follows:

TIMEOUT: DEVICE FAILED TO COMPLETE TEST TEST #:10 SUB-TEST #:7 FUNC BLK #:0600 LOGIC BLK #:0023 ERROR CODE:1

| PC = OOOOABOA | EXPECTED = 0001 |
|---|---|
| ADDRESS = 00846F5A | ACTUAL = 0000 |
| FILENAME = xpc.c | LINE = 1193 |
| PASSES = 00000001 | FAILURES = 00000001 |

Definitions for the above fields in the failing data format are as follows:

TIMEOUT This field provides a simple failing test error message for the operator explaining the nature of the failure;

TEST Test number of the failing test;

SUB-TEST Sub-test number of failing test;

FUNC BLK Functional block number of failing test;

LOGIC BLK Logic block number of the failing test;

ERROR CODE Error code number for the failing test;

PC Value of program counter at failure;

EXPECTED Expected data value for test;

ADDRESS Memory address of failure;

ACTUAL FILENAME LINE PASSES

FAILURES Number of times test failed.

While the above failing data format is preferred, it is of course understood that any suitable data format may be utilized without departing from the spirit of the present invention. The data format may be tailored to the particular needs of the design or test engineers, quality control personnel, etc.

At step 114, the CM 10 parses the pass/fail data received from the command line interface 50. The data is interpreted by the CM 10 and a decision is made in step 116 as to whether the PWA 60 passed the sequence of diagnostic tests. If the PWA 60 passed the tests, a message to this effect is displayed to the operator of the command module 10 at step 118. If the PWA 60 fails the test, the program proceeds to step 120 where a message is displayed to the operator of the CM 10 that the Actual returned data from test; Filename of failing test; Line of code where test failed; Number of times test was run; PWA has failed the test along with relevant information with respect to the test that failed.

If the device has failed a test, there are two possible methods for the data to be logged in the failure database 40. The operator can manually log this information into the failure database 40 as shown in step 120. Alternatively, the CM 10 can simply display the message to the operator that the PWA 60 has failed the test, and the CM can then automatically update the failure database with the failure information as shown in step 122.

In practice, the inventors of the instant application have determined that it is better to manually control the logging of failure data in the database 40 rather than have the CM 10 operate to automatically log the data. The reason is that experience has shown that "false" failures can be generated. For example, if a device is plugged into a test stand incorrectly, or if the operator fails to attach a test cable, etc, an error will be generated which has nothing to do with the running of an actual diagnostic. In such situations, if the failure data was automatically logged, false data would corrupt the integrity of the failure database 40. Such false data would have a negative impact on the efficiency of the system.

Accordingly, the preferred procedure is to proceed from step 116 to step 120 with the operator manually logging error data into the failure database 40. Once the error data is input to the database 40, the command module routine has completed and the procedure repeats itself from step 100 when the operator chooses to conduct a new series of tests.

As discussed above, the CM obtains the optimized sequence of diagnostic tests from the diagnostic optimizer 20. The operation of the diagnostic optimizer 20 can be better explained with reference to the flow diagram shown in FIG. 4. It should be understood that FIG. 4 illustrates a preferred embodiment for the diagnostic optimizer 20, but the diagnostic optimizer is in no way limited to the procedure outlined in FIG. 4.

Figure 4:
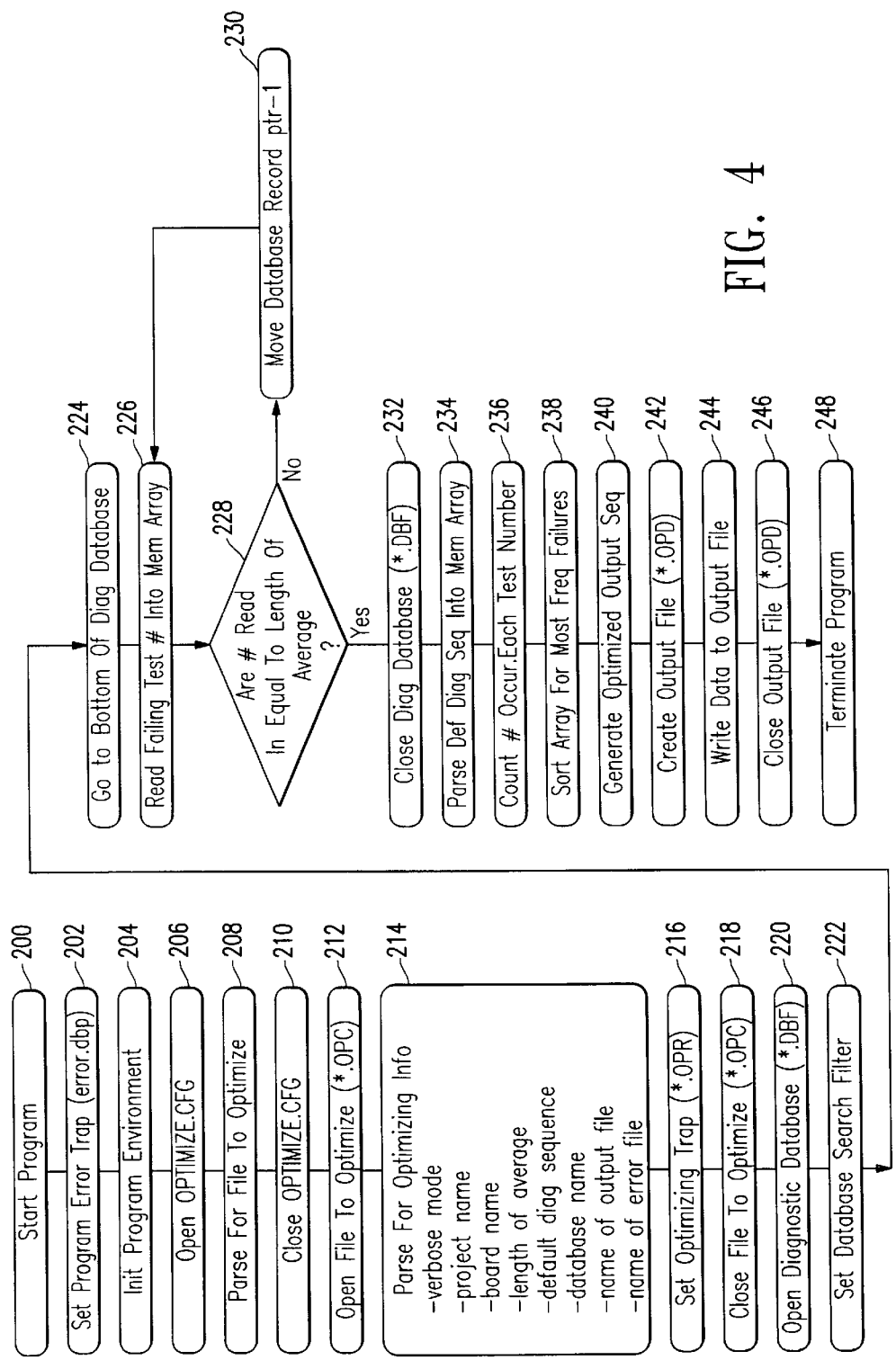
FIG. 4 is a flow chart of a preferred embodiment for the diagnostic optimizer shown in FIG. 2.

Prior to discussing the steps of the preferred embodiment, it should be noted that the optimization routine shown in FIG. 4 can be set up based on a testing procedure to generate a new optimized diagnostic sequence continuously or at selected time intervals, for example, hourly or daily. Alternatively, the optimization routine can be set to run for each new board, or it can be run manually by the operator via the command module 10.

How often the diagnostic optimizer 20 produces an optimized sequence for diagnostic testing does not affect (i.e. inhibit) the process of testing by the command line interface 50 and it can be tailored to the particular PWA or device under test. For example, if there are only two PWAs or devices being tested on a daily basis, the diagnostic optimizer 20 may be instructed to run daily. If a higher volume exists, it may be desirable to run a diagnostic optimizer 20 more frequently or even continuously. Finally, it should be understood that the operation of the diagnostic optimizer 20 is not necessarily dependent upon the operation of the CM 10, but rather, the diagnostic optimizer 20 can be programmed based upon the devices under test to produce optimized files on a continuous basis over a predetermined period of time.

Referring more particularly to FIG. 4, as with the CM 10 discussed above, the program begins at step 200 with a minimal amount of housekeeping such as variable definition, etc. which is required for most programs to start. At step 202 an error trap is enabled. All programming languages (i.e., the diagnostic optimizer may be written in any number of languages such as C, BASIC, etc.) provide means to "trap" errors during program execution. This prevents the programs from crashing the system or interfering with other running programs if the current program crashes.

The diagnostic optimizer in accordance with the present invention was written utilizing a development program known as FoxPro in which enabling of an error trap is a one-line statement which causes the program to call a subroutine upon encountering an error. The called subroutine writes a text file out to disk detailing the status of the program when it crashed and the reasons for the crash. This is a standard method of dealing with error trapping, and one skilled in the art would readily recognize this procedure.

At step 204 the program environment is initialized. In this step, public variables, graphic objects and initialization variables are defined. Again, this step is common in application software and is not unique to the present invention.

At step 206, the optimizer 20 opens a first set up file "OPTIMIZE.CFG" which is then parsed in step 208 for the name of the set-up file to read next. An example of the text contained in the "OPTIMIZE.CFG" file would be as follows:

file-to-opt: C:\DB\NIC_S.OPC

The opening and subsequent parsing of the "OPTIMIZE.CFG" file is accomplished with a low-level file-open utility which opens the file and reads in each line of text until a line containing a "key word" is found. In the above case, the key word would be "file to opt:". In step 210, once the key word is found in a line which is read, the file is closed. The key word is stripped from the line read and the remaining text (after leading and trailing blanks are stripped) is the value used by the program. This is a typical procedure for "parsing" set-up files. Using this technique, the set-up files can be created using any text editor and the key words can be placed anywhere in the set-up file in order to make the set-up file more "readable" by the programmer.

Steps 206–210 provide the optimizer 20 with the name of a second set-up file to be opened. The second set-up file is a file specific to the device under test. In the above illustrated case, the second set-up file would be "NIC S.OPC." It should be noted that it might be possible to accomplish the same goals achieved by steps 206–210 by passing the name of the file as a command line argument. While this alternative is possible in "C" and other low-level languages, it is not possible in FoxPro.

Once the name of the second set-up file is acquired, it is opened in step 212. Using the same subroutine which extracted the key word in step 208, the opened file is then parsed in step 214 for optimizing information necessary for the optimizer 20 to run. Such information includes the mode for the optimizer to run in (verbose or silent), project name, board name, failure database name (including location such as F: drive), etc. as shown in FIG. 4.

The diagnostic optimizer can operate in verbose or silent modes. In the silent mode, typically used when the CM 10 is controlling the testing process in an automatic fashion, optimizer 20 provides no information back to user of the CM 10 during the test sequence. In verbose mode, the user of the CM 10 receives a real-time display of information related to the testing process (e.g. a determined fault spectrum, product information, testing status, etc.). It should be noted that steps 206–214 permit the same optimizer code to be run for several different board types (i.e., several different products to be tested), each of which has their own set-up file. As a result, this prevents writing code dedicated to a particular device and permits "software re-use."

At step 216, a second error trap is enabled. While the first error trap enabled in step 202 handles any failure of the program up until this point (generic failures), the second error trap enabled in step 216 handles any failure which is particular to the board being tested. Providing multiple error files enables separate error messages to be kept for each board for which the optimizer 20 is run. It has been the experience of the inventors that the diagnostic optimizer 20 will crash only if the setup file has invalid parameters, such as telling the diagnostic optimizer 20 that the failure database is on a non-existent hard drive, etc. In most cases, the error file simply acts as a tool to assist in configuring each setup file for each new board. Once the setup file for a given device to be tested is correctly set up, it has been the inventors' experience that the diagnostic optimizer, rarely, if ever, fails.

At step 218 the setup file with the settings for the diagnostic optimizer 20 is closed. At step 220 the diagnostic optimizer 20 opens the failure database 40 whose name was provided at step 214. In order to work on a local area network, the failure database must be opened in a nonexclusive mode. This means that many people can read the same open file at the same time. This is typical for most multiuser database applications.

After the failure database 40 is opened in step 220, a search filter is established in step 222. In the preferred embodiment of the present invention utilizing FoxPro, this is a simple one-line command which tells the database that whenever you request information it should only use entries which meet certain conditions (i.e., the search filter). In continuing with the example for testing printed wire assemblies, the filter in such an example would include such information as the project name or the name of the PWA under test. If this information were not to be included in the search filter, the program would end up utilizing failure data from different projects or different products, and not just the particular project or product for which optimization is desired.

After the search filter is set in step 222, a record pointer (a "record" contains all the data pertaining to a particular failure entry, with the record pointer simply indicating which of the many entries are being looked at) is set to the bottom of the failure database. Each new failure record is appended at the end of the failure database 40. Thus, the most recent data exists at the bottom of: the failure database. From the parsed optimizing information obtained in step 214, the diagnostic optimizer 20 is provided with an indication as to how many failing records (length of average) are to be considered when generating the optimized sequence of diagnostic testing.

In step 226, a single record, which meets the requirements of the search filter established in step 222, is read from the failure database and stored in a memory array for further processing. The diagnostic optimizer then proceeds to step 228 where a test is conducted to determine if the number of records read from the failure database is equal to the "length of average" setting which was provided in step 214. If the result of the decision in step 228 is NO, the diagnostic optimizer adjusts the database record pointer in step 230 and proceeds to read the preceding record in the failure database 40 at step 226. The loop 226–228–230 is conducted until a YES response is achieved at decision block 228. The optimizer then proceeds to step 232 where the failure database is closed.

In step 234, a default diagnostic testing sequence, which was supplied at step 214, is parsed so as to change it from a text string into a set of test numbers which are stored in the memory array. This transition can assist to speed up some of the sorting which is discussed in more detail below.

In step 236, using the array of test numbers obtained from the parsing of the default sequence, an individual count of failures for each of the test numbers produced in step 234 is produced from the data extracted from the failure database. This information is placed into another memory array which is then sorted in step 238 based upon the number of failures. The sorting in step 238 of the count information is used to re-sequence the test number entries in the memory array starting with the most failures and working down numerically to tests with less or no failures. Tests with no failures maintain their relative sequence as defined in the default diagnostic sequence. Thus, the most frequently failing tests will appear first in the newly sorted data.

The sorting of the tests from most frequent failures to least frequent produces a fault spectrum based upon frequency of failure. This information is utilized to generate a new optimized test sequence which re-orders the test numbers from most frequently failing to least frequently failing in step 240.

An output file is created at step 242 (note that the name of the output file is also obtained in step 214), and, in step 244, data corresponding to an optimized sequence for testing is then written into the newly created output file. The output file is then closed in step 246 and the diagnostic optimization program terminates at step 248.

A typical optimized file might have the following information: date; time; project name; board name; number of records available for search from the failure database; number of available records utilized to obtain the optimized file information; date of the earliest record reviewed; date of the latest record reviewed; location of the database searched; output file name; the original order of the diagnostic tests; the optimized order for the diagnostic tests; and finally, the raw sort data showing the number of failures found in the database for each of the diagnostic tests.

FIG. 5 shows a preferred setup for the structure of the failure database. The failure database can include a number of fields 400 whose contents 402 range from the name of the overall project for which the device is used, to general comments from the test engineer with respect to particular tests which have been conducted. The field type 404 distinguishes the type of data which will be found in the contents field 402. The length of the field can extend from several characters to an unlimited amount of information.

Of course, one skilled in the art will readily recognize that the structure for the failure database can be altered depending upon a user's particular requirements. For example, Tandem Computers, Inc. utilizes part numbers having up to six characters. Thus, the field length is 6. Clearly, different companies utilize different part numbering schemes and the length of this field can be adjusted, or the field can be eliminated entirely, depending upon the needs of the user.

Referring back to FIG. 2, the diagnostic optimizer 20 provides the optimized sequence of diagnostics to the command module 10 which then supplies this information to the command line interface 50 so that the diagnostic testing is performed in accordance with the optimized sequence. The program flow diagram for the command line interface 50 is shown in more detail in FIG. 6.

The terminology "command line interface" is used to describe that portion of the real-time diagnostic optimization system which controls the communication between the controller 1 and the device under test 60 or the tests to be conducted 70. The command line interface can comprise a program which resides in ROM or other memory either in the test controller 1 or in the device under test.

Devices which incorporate tests stored on-board in ROM will typically have a command line interface associated therewith. It is not necessary for the command line interface to reside on the device which is under test, but this is common in the manufacture of high technology components such as computers, computer components, PWAs, etc. A command line interface would not be required to communicate with an unintelligent device such as a mechanical object (e.g. a wheel structure) being manufactured. In this situation, the command line interface could reside in the controller 1 or in the test station location and will execute the tests 70 as specified by the command module 10 and report the results of the tests back to the command module.

Referring to the example of testing PWAs, the command line interface 50 provides a simple mechanism for interfacing the real-time test controller 1 with the PWA 60 and for controlling the execution of the diagnostic tests 70. In essence, the command line interface 50 can be visualized as a portion of code which exists between the user of the CM 10 and the diagnostic tests 70 which are actually conducted on the PWA 60.

At the simplest level, the user can type commands directly into the command line interface 50. For example, with a command line interface 50 which is located on a PWA also having diagnostic tests in ROM, it is possible to connect the PWA with a terminal (e.g. a hand-held computer having serial port, a "dumb" terminal, or a personal computer) through which a user can directly enter commands for the command line interface to execute selected ones of the tests stored in the ROM. However, for ease of use, the command line interface 50 in the present invention remains hidden from the user who interacts with the CM 10. The CM 10 is a much more efficient, simpler method for interacting with the command line interface.

Figure 6:
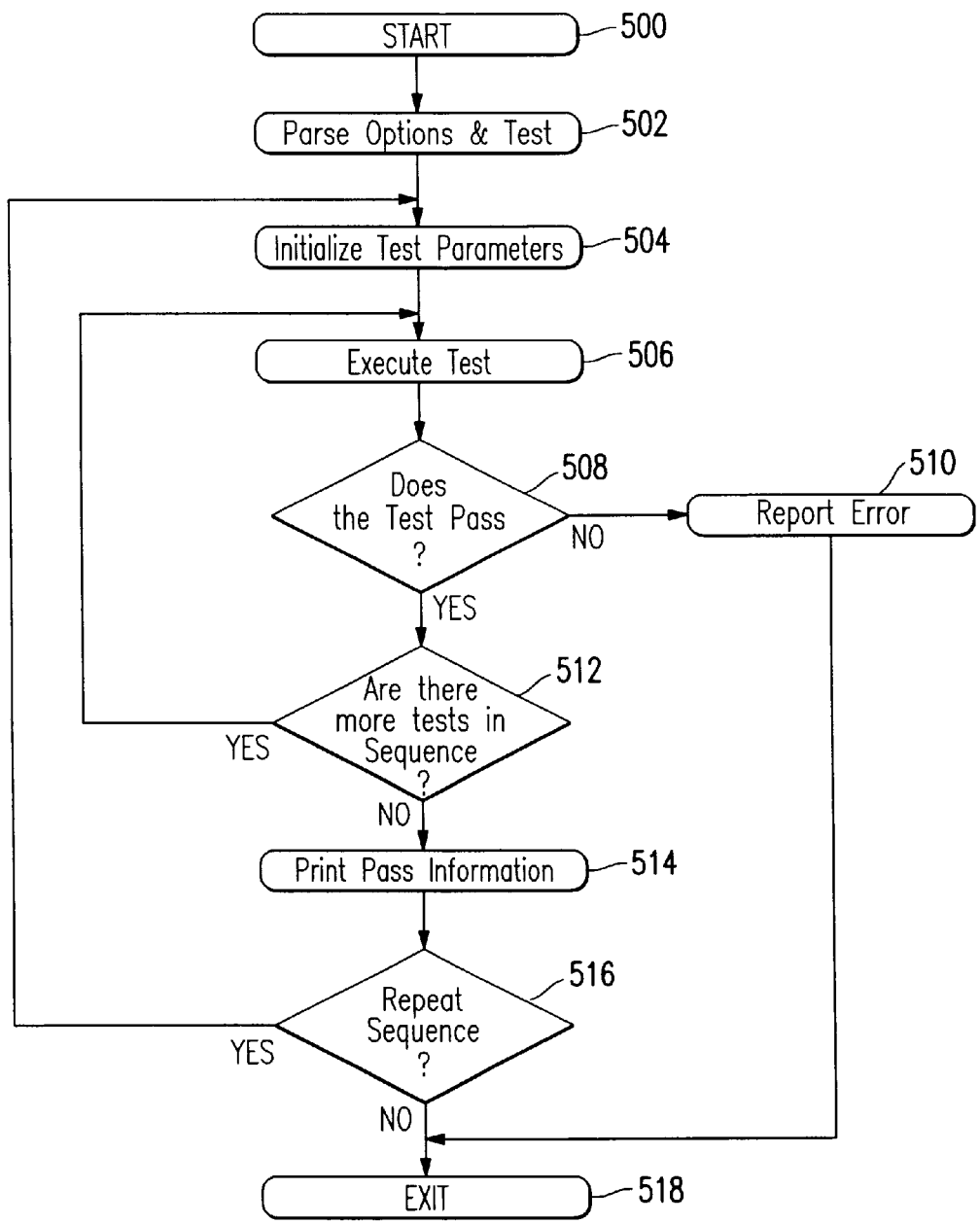
FIG. 6 is a flow chart showing the preferred embodiment of the program flow for the command line interface shown in FIG. 2.

Referring to FIG. 6, at step 500 the command line interface routine commences and standard initialization operations as discussed above with respect to the CM and the diagnostic optimizer are performed.

At step 502, the command line interface parses an input line from the command module into commands, options and tests. The input command includes the optimized list of diagnostic tests to be conducted on the PWA 60, along with any options selected by the user of the CM 10 (e.g. repeating the sequence 10 times, etc.). After the user input has been parsed, the command line interface initializes any parameters necessary for the testing procedure in step 504. For example, if the user wishes to execute the same test 100 times, the program must set the appropriate counter to 100.

Alternatively, the CM 10 could simply provide the command line interface 50 with the name of the optimized file produced by the diagnostic optimizer 20, together with any desired options. In such a case, the command line interface can easily be provided with a file open utility, as are the CM 10 and the diagnostic optimizer 20, in order to open a file containing the optimized sequence of diagnostics and then parse the open file for the optimized sequence.

At step 506 a test is actually executed and the command line interpreter 50 waits for the test to complete. At step 508, the test is completed and it is determined whether the device has passed or failed the test. If the test: has failed, a report error is generated at step 510 and this information is returned to the command module 10. The command line interpreter 50 would terminate the current sequence and exit at step 518.

If the test was successfully completed, the command line interface 50 proceeds to step 512 where a determination is made as to whether all tests have been conducted. If more tests are to be conducted, the process returns and executes the next test at step 506. When all tests have been completed, the command line interface 50 proceeds to step 514 where a passing information report is generated. Finally, at step 516 it is determined whether the entire sequence of tests needs to be repeated (as discussed above, the user of the CM may wish to repeat the sequence of tests). If so, the command line interface returns to step 504, the test parameters are initialized, and the entire testing sequence is repeated.

Figure 7:
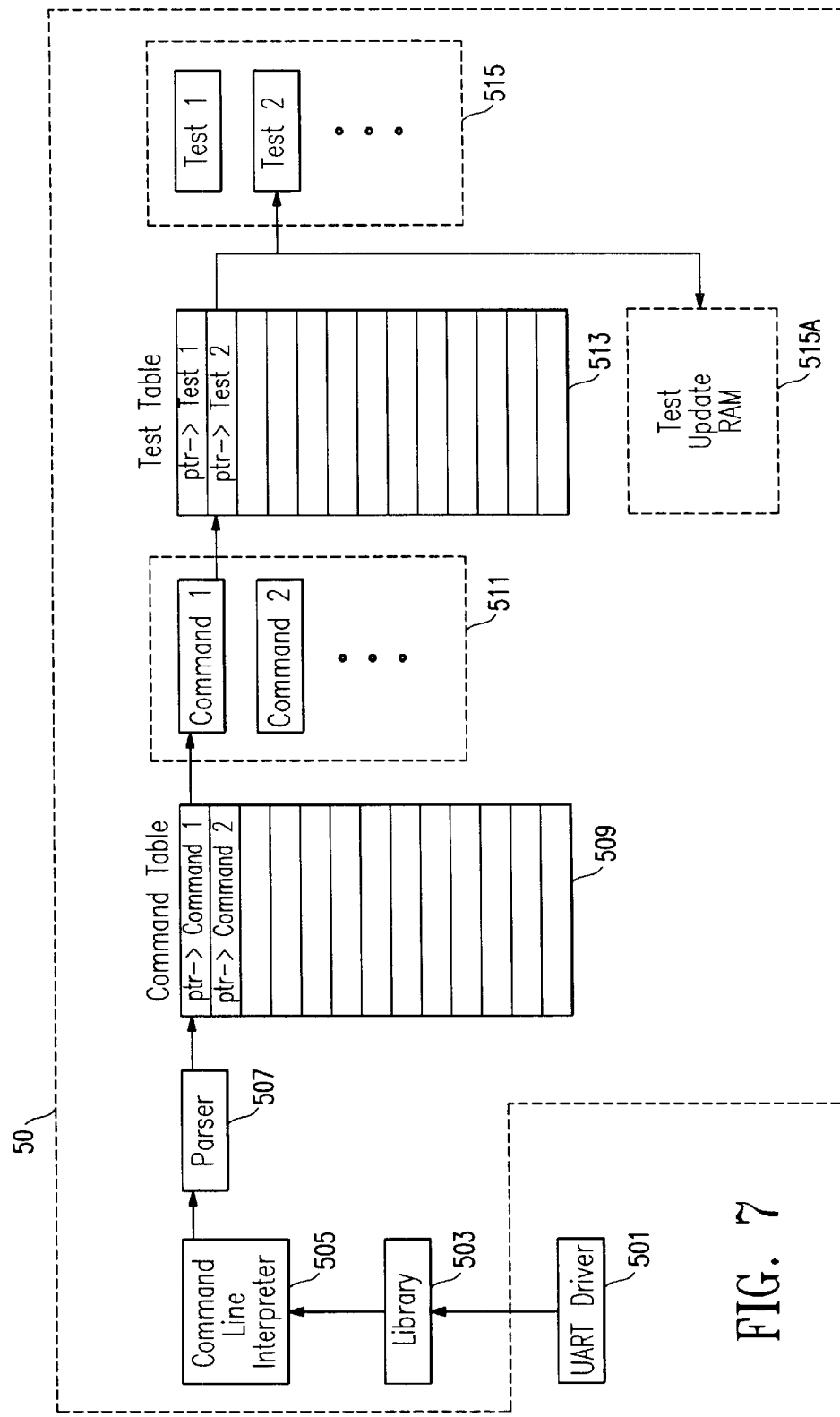
FIG. 7 shows in block diagram form the preferred architecture for the command line interface shown in FIG. 2.

FIG. 7 shows the overall architecture for the command line interface 50 in the real-time test controller 1. As discussed above and as shown by the dashed lines, the command line interface 50 may, although it is not required, reside in the device 60 under test. It should be understood that the only major requirement of the command line interface 50 is that it have a standardized input line and a standardized output line. If these two requirements are fulfilled, and if the diagnostics are stand-alone (i.e., they can be run in any order and by themselves), any implementation will allow interfacing with a command module 10. Since the command module 10 can be a software routine which calls the optimizer and passes the optimized string or filename to the command line interface 50, the actual real-time diagnostic optimization scheme may be independent of the architecture of the command line interface 50.

Referring in detail to FIG. 7, a universal asynchronous receiver transmitter 501 (DART) handles communication between the device under test and the real-time test controller 1. A library 503, which may reside in any type of memory device, provides a library of commands enabling interaction with the UART hardware. For example, in the preferred embodiment of the present invention, the library 503 consists of a number of "C" language commands such as "getchar" which gets a character from a string of data. However, the library must also include commands that handle the interfacing with the actual hardware being tested.

A command line interpreter 505 (not to be confused with the command line interface 50) interprets the incoming commands from the DART 501 and also sends commands to the UART 501. The commands are passed to a parser 507 which extracts appropriate data from the command, and then searches a command address table 509 to find the actual address of the command to be executed.

The entered command, whose address was found in the command address table 509, is then read from the stored command list 511 and executed. The execution of the command causes the address of the desired test to be looked up in the test address table 513 and the desired test, which is stored in a test storage table 515, is then executed. The test storage table 515 typically comprises a ROM for storing the diagnostic tests developed by the diagnostic engineer as discussed above.

For example, referring to FIG. 7, assuming the command received at the UART is command 1 in table 511, which is the command to execute test number 2, the address of test number 2 will be looked up in table 513 and the address of the test in test storage table 515 will be produced and test 2 will be executed. The opposite would occur if command 2 were received and it were the command to execute test number 1.

The purpose for executing test 2 first and then test 1 may be that the result of the optimization conducted by the diagnostic optimizer 20 showed that test 2 has failed more often than test 1, and thus in order to optimize the testing sequence, it would be appropriate to perform test 2 before test 1.

FIG. 7 includes a test update random access memory (RAM) 515A. The test update RAM 515A is capable of receiving updated diagnostic tests which may supplement or supplant the diagnostic tests stored in the ROM 515. It is also possible for supplemental/replacement tests to be maintained either in the controller 1 or in a memory in a test station. However, where the device under test comprises, for example, a PWA for a computer system, the storage of tests on-board is often essential for diagnostics in the event of a system failure. In such a system, it is standard for prior art devices to simply include such tests in ROM.

There are several disadvantages with a ROM based system. The updating of the tests stored in ROM is a difficult process and may take months to implement. Further, in large scale computer installations, it is not uncommon for there to be two to four updates required in a year. In a ROM based system, this requires replacing the ROM chips. With a large customer base, this is not practical or cost efficient.

An alternative to the ROM based systems are RAM systems. In a RAM system, the tests are downloaded as needed. There are problems with a RAM system in that the diagnostics can often be very large programs which require a very long time to download. Again, with a large customer base, this is not practical. Further, it is not uncommon for RAM chips to have problems. If the RAM malfunctions, it is time consuming to replace and in the meantime, it is not possible to implement the diagnostics.

To solve the problems with such systems, the present invention provides for a combination of ROM and RAM. In such a system, updates are easy since it is possible to download just the updates as opposed to the having to download the base diagnostics which are stored in the ROM. Further, if the RAM is bad, the diagnostics stored in ROM are unaffected. Thus, with a ROM/RAM combination system, instantaneous patches or updates are possible and the benefits of having tests stored on the device are still present.

From the foregoing, it will be appreciated that the present invention provides a simple, cost-effective, efficient means for determining the optimum sequence for conducting diagnostic testing in a manufacturing or similar environment. By providing an optimized sequence for the diagnostic testing, thousands of wasted testing hours can be avoided through the detection of non-random fault clusters and the adjusting of the testing sequence to test first for failures which appear to be associated with such non-random fault clusters. The quick detection of a non-random fault cluster, followed by the re-sequencing of the diagnostic testing process to first test faults associated with the non-random fault cluster, can reduce testing time and more efficiently allocate the resources of the testing facility.

Thus, the present invention provides a significant advantage over the known testing routines commonly utilized in manufacturing and similar facilities.

It will be appreciated that the foregoing description of the present invention is of a presently preferred embodiment of the real-time diagnostic optimizer. It should also be appreciated that a wide variety of modifications and combinations of the various modes illustrated may be provided while remaining within the scope of the present invention.

For example, the test controller 1 may comprise a personal computer, minicomputer, special purpose digital computer or similar device, or may be constructed as an integrated circuit card which is inserted into one of the above devices. The real-time test controller 1 could also take the form of an application specific integrated circuit (ASIC) in conjunction with a dedicated memory sub-system. In a computer based system as discussed above, software routines could be stored in either dedicated ROM (or other suitable storage device) modules or in a protected section of a hard disk system. Such a system would utilize the communication ports of the computer (parallel, serial or user-specific) to interact with the device under test such as the PWA 60.

Accordingly, the foregoing description of the preferred embodiment should be viewed as illustrative in nature only and does not serve to limit the present invention in any way. The present invention is limited solely by the claims which are appear below.

We claim:

1. A method for testing manufactured products, comprising:

conducting at least one diagnostic test on a manufactured product at each of a plurality of testing locations;

moving the manufactured product between the plurality of testing locations;

storing test failure data indicative of failure rates of previously failed diagnostic tests conducted at each of the plurality of testing locations from previous test runs;

reading, before the beginning of the current test run, a selected amount of the stored test failure data indicative of failure rates and determining an optimum sequence for using the plurality of diagnostic tests in the current test run by sorting the diagnostic tests in order of the failure rates of the previously failed diagnostic tests; and moving the manufactured product between the plurality of testing means in accordance with the optimum sequence for using the plurality of diagnostic tests in the current run.

2. A system for testing manufactured products, comprising:

a storage medium, located on the manufactured products, for storing a plurality of diagnostic tests for use in testing the manufactured products; a plurality of testing stations, located external to the manufactured products, for accessing the storage medium and testing each of the manufactured products using the plurality of diagnostic tests stored in the storage medium on the products in a predetermined sequence;

a memory for storing test failure data indicative of failure rates of previously failed diagnostic tests;

a command module for reading a selected amount of the stored test failure data indicative of failure rates and determining an optimum sequence for using the plurality of diagnostic tests for a new test run by sorting the diagnostic tests in order of the failure rates of the previously failed diagnostic tests; and a test controller for, before the beginning of a new test run, replacing the predetermined sequence with the optimum sequence.

3. The system of claim 2, wherein the storage medium comprises:

a read only memory for storing a first plurality of diagnostic tests; and a random access memory for storing at least one additional diagnostic test or portion of a diagnostic test.

4. A real-time test controller, comprising:

a command module;

a failure database, coupled to the command module, for storing failure data from diagnostic tests;

a diagnostic optimizer, coupled to the failure database, for producing an optimized sequence of diagnostics for a device under test from data in the failure database; and a command line interface, coupled to the diagnostic optimizer, for re-sequencing a plurality of diagnostic tests for the device under test to match the optimized sequence of diagnostics.

5. The real-time test controller of claim 4, further comprising a plurality of diagnostic tests coupled to the command line for testing devices.

6. The real-time test controller of claim 4, wherein the diagnostic optimizer is further configured to produce, from the data in the failure database, a fault spectrum of faults occurring in previous testing.

7. The real-time test controller of claim 4, wherein the command module further comprises a graphical user interface, including a debug mode, and a feature to automatically print error tags.

8. The real-time test controller of claim 4, wherein the command module further comprises a user interface, including a feature for automatic programming of manufacturing data.

9. The real-time test controller of claim 4, wherein the command module further comprises a user interface, including a feature for manual programming of manufacturing data.

10. The real-time test controller of claim 4, wherein the command module further comprises a user interface, including a terminal emulation mode.

11. The real-time test controller of claim 4, wherein the command module further comprises a user interface, including a feature for creating, saving and loading customized testing sequences.

12. The real-time test controller of claim 4, wherein the command line interface resides in the device under test.

13. The real-time test controller of claim 4, wherein the command line interface has a standardized input line and a standardized output line.

14. The real-time test controller of claim 4, further comprising a universal asynchronous receiver transmitter (UART) for processing communication between the device under test and the real-time test controller.

15. The real-time controller of claim 4, wherein the command line interface further comprises:

a universal asynchronous receiver transmitter (UART) for processing communication between the device under test and the real-time test controller;

a library, coupled to the UART, for providing commands enabling interaction with the UART;

a command line interpreter, coupled to the library, for interpreting incoming commands from the UART and sending commands to the UART; and a parser, coupled to the command line interpreter, for extracting data from an incoming command and locating an actual address of the command to be executed.

16. The real-time controller of claim 15, wherein the actual address of the command to be executed refers to a location in read-only memory (ROM).

17. The real-time controller of claim 16, wherein the command line interface further comprises a test update random access memory (RAM), for receiving updated diagnostic tests.

18. A system for testing manufactured products, comprising:

conducting means for conducting at least one diagnostic test on a manufactured product at each of a plurality of testing locations;

first moving means, coupled to the conducting means, for moving the manufactured product between the plurality of testing locations;

storing means, coupled to the conducting means, for storing test failure data indicative of failure rates of previously failed diagnostic tests conducted at each of the plurality of testing locations from previous test runs;

reading means, coupled to the storing means, for reading, before the beginning of the current test run, a selected amount of the stored test failure data indicative of failure rates and determining an optimum sequence for using the plurality of diagnostic tests in the current test run by sorting the diagnostic tests in order of the failure rates of the previously failed diagnostic tests; and second moving means, coupled to the conducting means, for moving the manufactured product between the plurality of testing means in accordance with the optimum sequence for using the plurality of diagnostic tests in the current run.

* * * * *